United States Patent
Van Den Broek et al.

(10) Patent No.: US 6,764,953 B2
(45) Date of Patent: Jul. 20, 2004

(54) ELECTRONIC DEVICE, AND METHOD OF PATTERNING A FIRST LAYER

(75) Inventors: Jan Johannes Van Den Broek, Eindhoven (NL); Coen Theodorus Hubertus Fransiscus Liedenbaum, Eindhoven (NL); Andreas Hubertus Montree, Eindhoven (NL); Arjen Boogaard, Eindhoven (NL); Willem Reindert De Wild, Nuenen (NL); Johannes Nicolaas Huiberts, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/298,972

(22) Filed: Nov. 18, 2002

(65) Prior Publication Data

US 2003/0118751 A1 Jun. 26, 2003

Related U.S. Application Data

(62) Division of application No. 09/872,996, filed on Jun. 1, 2001, now Pat. No. 6,509,650.

(30) Foreign Application Priority Data

Jun. 2, 2000 (EP) .............................. 00201954

(51) Int. Cl.$^7$ ...................... H01L 21/44; H01L 21/461

(52) U.S. Cl. ...................... 438/688; 438/530; 438/600; 438/601; 438/752

(58) Field of Search ................................ 438/752, 718, 438/688, 533, 511, 530, 596, 590, 600, 601, 619, 662, 660

(56) References Cited

U.S. PATENT DOCUMENTS

| | | | | |
|---|---|---|---|---|
| 3,634,927 A | * | 1/1972 | Neale et al. | |
| 3,771,026 A | * | 11/1973 | Asai et al. | |
| 6,184,121 B1 | * | 2/2001 | Buchwalter et al. | |
| 6,529,116 B2 | * | 3/2003 | Van Den Broek et al. | .. 338/309 |

* cited by examiner

Primary Examiner—Ha Tran Nguyen
(74) Attorney, Agent, or Firm—Peter Zawilski

(57) ABSTRACT

The electronic device (1) has a layer (11) of a material comprising a first and a second element. This material has an amorphous and a crystalline state. A transition from the amorphous to the crystalline state can be effected by heating of the material to above a crystallization temperature, for example with a laser. As a result, the layer (11) has a first electrically conducting areas (21), comprising the material in the crystalline state, which are insulated from each other by the first electrically insulating area (23), comprising the material in the amorphous state. The layer (11) may be present as an interconnect layer, but also as a covering layer. Preferably, the material is aluminum-germanium. In the method of patterning a layer (11), electrically conductive areas of the layer can be strengthened by electroplating.

4 Claims, 4 Drawing Sheets

ELECTRONIC DEVICE, AND METHOD OF PATTERNING A FIRST LAYER

This is a divisional of application Ser. No. 09/872,996, filed Jun. 01, 2001 now U.S. Pat. No. 6,509,650.

The invention relates to an electronic device comprising a substrate having a first side, which substrate is provided at said first side with a first layer, which first layer comprises an electrically conducting portion and adjoining thereto an electrically insulating portion.

The invention also relates to a method of manufacturing an electronic device comprising the step of patterning a first layer in accordance with a chosen pattern, which first layer lies on a substrate and comprises an electrically conducting portion and an electrically insulating portion after patterning.

Such a device is known from U.S. Pat. No. 5,736,452. The first layer comprises a pattern of electrically conducting portions of aluminum which are separated from one another by electrically insulating portions of an electrically insulating material. The first layer in the device is manufactured in a usual manner, i.e. by the following steps: deposition of inter alia aluminum; provision of a layer of photoresist thereon; exposure of the photoresist in accordance with the chosen pattern through a photolithographic mask made for the purpose; development of the photoresist; removal by etching of the uncovered aluminum with any remaining photoresist thereon; removal of remaining photoresist from the etched aluminum; and deposition of the electrically insulating material on the etched aluminum.

It is a disadvantage of the known device that its manufacture is cumbersome.

It is a first object of the invention to provide an electronic device of the kind mentioned in the opening paragraph whose first layer is easy to manufacture.

It is a second object of the invention to provide a method of the kind mentioned in the opening paragraph in which the use of a photoresist is not necessary.

According to the invention, the first object is achieved in that:
  the first layer comprises a material which is built up from at least a first and a second element,
  the material has an amorphous state and a crystalline state,
  the electrically insulating portion comprises the material in its amorphous state, and
  the electrically conducting portion comprises the material in its crystalline state. Both the amorphous and the crystalline state of the material are utilized in the electronic device according to the invention. The material is present in its crystalline state in the electrically conducting portions of the first layer. The material in the amorphous state acts as an electrical insulation between the electrically conducting portions of the first layer. The material in its crystalline state has in fact a better electrical conductivity—i.e. a lower resistivity—than in its amorphous state. Preferably, the conductivity in the crystalline state is more than $10^4$ times that in the amorphous state.

In its amorphous state, moreover, the material may act as an electrical insulation between conductor tracks outside the first layer, which conductor tracks are as yet not electrically interconnected. At any moment after the manufacture of the device according to the invention, a transition from the amorphous to the crystalline state may be achieved locally in the material. This gives rise to one or several electrically conducting portions which electrically interconnect the conductor tracks outside the first layer. The transition from the amorphous to the crystalline state may be achieved in a portion of the first layer through heating of this portion. The transition remains limited to the heated portion.

The first layer provided with the electrically conducting and the electrically insulating portions may be readily manufactured in that the first layer of the material is deposited in the amorphous state and is subsequently patterned through local heating of the material in accordance with the chosen pattern.

The first layer of the device according to the invention may lie directly on the substrate, or alternatively it may be present as an intermediate layer in the device, or at a surface of the device. The device is, for example, an integrated circuit, a display, a filter, an optoelectronic device, or a network of passive components.

*Phys. Rev. Letters* 21 (1968), 1450–1453 by S. R. Ovshinsky discloses a device comprising a material in which a transition from an amorphous state to a crystalline state of the material is utilized for switching and for making a memory unit. In the device according to the invention, crystalline and electrically conducting portions are present in a largely amorphous and electrically insulating layer. Whereas the material in the known device comprises at least the atoms of tellurium or arsenic, there is no need for this in the device according to the invention.

A number of materials are known from EP-A-0 644 537 in which a transition from an amorphous state to a crystalline state is achieved through irradiation with a laser beam. A difference in optical reflection is achieved thereby, which is utilized for data storage. It is not known or even suggested therein that such materials can be used in alternative applications on account of their difference in conductivity. Applications in which this difference in conductivity is utilized, such as the device according to the invention, are not demonstrated.

The material aluminum-germanium is known from Catalina et al., *Thin Solid Films* 167 (1988), 57–65. This article, however, does not show or suggest the use of the material in an electronic device. The article contains no suggestion on patterning of a first layer through local heating of the aluminum-germanium.

It was surprisingly found in experiments which led to the invention that several atoms may be chosen for the first element of the material, and that the second element may be chosen from gallium, germanium, and indium. If silicon is chosen as the second element, a slight drop in the resistivity is found, such as with Cr—Si, or the amorphous state is found to be instable, as is the case for Al—Si. Preferably, the proportional quantity of the second element in the material is at least 10%.

Examples of first elements are inter alia vanadium, cobalt, nickel, copper, zinc, gallium, aluminum, silver, tellurium, zirconium, titanium, molybdenum, antimony, arsenic, and tungsten. The first and the second element are different here. Preferably, the proportion of the first atoms type in the material exceeds 30%. Examples of first materials are Al—Ge, Ge—Te, Ga—Sb, and In—Sb.

The material may comprise a third element. The inclusion of the third element in the material may raise the resistivity in the amorphous state.

It is favorable when the first element of the material in the first layer is aluminum, and the second element is germanium, the germanium content being at least 20%. The crystalline state of the material aluminum-germanium has two phases: a phase of substantially pure crystalline aluminum and a phase of substantially pure crystalline germanium. Examples of favorable compositions of the aluminum-germanium are shown in Table 1.

A first advantage of aluminum-germanium as the material is that a conductivity was found for the material in its crystalline state which is only ten times smaller than that of pure aluminum. The inventors are of the opinion that this is caused by the presence of a substantial proportion of a crystalline phase of aluminum. A second advantage of the aluminum-germanium is that the crystallization temperature lies between 120 and 250° C. This is a temperature which can be readily achieved by local heating with a laser beam. At the same time, this temperature is high enough for preventing a spontaneous transition from the amorphous to the crystalline state. A third advantage is that the elements of aluminum and germanium are known per se in the manufacture of, for example, semiconductor devices. The purchase price of aluminum and germanium is comparatively low. A fourth advantage is that aluminum and germanium are easy to process. These substances are not toxic or reactive in combination with, for example, oxygen and water.

In a first embodiment of the device according to the invention, a first and a second conductor track are present, and an electrically conducting portion of the first layer extends from the first to the second conductor track. The electrically conducting portion in this embodiment is an interconnect between the first and the second conductor track. The first portion may be an interconnect which provides a lateral connection; in that case the first portion comprises an extension from a first to a second point in the first layer. Alternatively, the first portion may be an interconnect which provides a vertical connection; in that case the first portion comprises an extension transverse to the first layer. Such an interconnect is known to those skilled in the art as a via. The conductor tracks themselves in the device may be, for example, an interconnect or an electrode of a transistor, of a capacitor, or of a resistor.

A first advantage of this embodiment is that a further interconnect can be manufactured without the necessity of making a new photolithographic mask. The adaptation of a pattern of interconnects is easy. An interconnect, once made, may be removed by means of laser ablation. A second advantage of this embodiment is that the first layer can be used as an auxiliary layer in addition to a normal interconnect. If the normal interconnect should fail to function, the device can be repaired in that the first portion of the first layer is crystallized.

In a first modification of the first embodiment, the electrically conducting portion of the first layer is covered with a second layer of electrically conducting material. The second layer is preferably provided by means of electrochemical deposition. For example, the second layer has a thickness of a few micrometers, and a coil is defined in the second layer. The second layer may alternatively comprise an end contact or a bond pad.

In a specific modification, the first layer has a relief structure. The first insulating portion is partly removed from the first layer. As a result, the substrate is free from a covering first layer at the first side at the area of a removed portion. The removal of portions may take place, for example, by laser lithography or by etching. It is an advantage of this modification that undesirable currents through the electrically insulating portion of the first layer are prevented. A current through the first, interposed, electrically insulating portion may be substantial, especially if the first and a second electrically conducting portion in the first layer lie approximately parallel at a short distance from one another. If the first layer has a relief structure—the electrically insulating portion being at least partly absent between the first and the second conductive portion—, this current will be substantially absent. An application of this embodiment is, for example, a polymeric substrate—a printed circuit board—on which the first layer and a number of components are present.

In another modification of the first embodiment
the first layer has a first and a second side, which sides face away from one another and are at least partly parallel to the first side of the substrate,
the first conductor track is situated at the first side of the first layer, and
the second conductor track is situated at the second side of the first layer.

In this modification, the first portion of the first layer may be a vertical interconnect area or via. The second electrically conducting pattern may alternatively be an electroplated enhancement of the electrically conducting portion of the first layer. The achieved advantage of an easy manufacture is particularly apparent in the case of a via in the first layer. Not only is the manufacture of the via in the first layer limited to one step instead of a large number of steps, but in addition a planarizing step is unnecessary. The risk of leakage currents between adjoining vias in the first layer can be prevented substantially completely in that the first layer is given a small thickness; preferably, the thickness of the first layer is smaller than 100 nm, and more preferably smaller than 50 nm. The decrease in thickness causes the resistance value of the via between the first and the second conductor track to decrease, while at the same time the resistance value for the leakage between adjoining vias increases.

In a second embodiment of the device according to the invention:
a first component with a first conductor track for external contacting is present on the substrate,
said first component is hermetically enclosed in an envelope having an outer side, which envelope comprises the first layer and the substrate, and
the first conductor track of the first component can be contacted at the outer side of the envelope via the electrically conducting portion of the first layer.

In this embodiment, the first layer is a protective layer of the device, the electrically conducting portion being a connection surface for external contacting. The first component may be accommodated on the substrate, or alternatively it may be manufactured on the substrate through deposition of consecutive layers. Besides the first component, a plurality of components may be hermetically enclosed by the first layer and the substrate. If so desired, the electrically conducting portion at the outer side of the envelope may be electrochemically enhanced with a second pattern. It is furthermore possible for the first portion of the first layer to extend from the first side to a second side of the substrate, which second side faces away from the first side. The first portion, possibly with its electrochemical enhancement, then is a U-shaped connection surface. This has the advantage that the device is a Surface Mountable Device.

The use of the first layer as a protective layer is advantageous. Such a protective layer is known to those skilled in the art as an electronic package which provides a hermetic sealing of an enclosed component. A first advantage is the simple manner in which electrically conducting portions can be provided: first the first layer is provided, and then a transition to the crystalline state is achieved in a first portion which adjoins the first conductor track. A second advantage is that the package of the material provides not only a good mechanical protection, but also protects against electrostatic discharges and corrosion. A metal layer is impermeable to gases and water. A third advantage is that electrically conducting portions can be provided in the first layer of the material also after the manufacture of the device has been completed. The provision of electrically conducting portions may take place, for example, during the mounting process of the electronic device on a printed circuit board.

The second object relating to a method of the kind mentioned in the preamble is achieved in that
 the first layer comprises a material which is built up from at least a first and a second element, and which has an amorphous state and a crystalline state,
 the first layer is heated in accordance with the chosen pattern up to at least a crystallization temperature of the material, whereupon the material is present in its crystalline state in the patterned electrically conducting portion and in the amorphous state in the electrically insulating portion.

After the first layer has been provided, a pattern of electrically conducting portions can be manufactured in an electrically insulating layer in a single step by the method according to the invention. The method is simple. The method is environmentally friendly because the use of photoresists and etchants for patterning the layer is unnecessary. Furthermore, the method is inexpensive.

An advantage of the method according to the invention is that a pattern of electrically conducting portions can be modified. Thus defects in patterning and design defects can be remedied, so that yield losses are prevented. It is also possible to provide the pattern of electrically conducting portions after the manufacture of an electronic device comprising the first layer has been completed. Changes in a design or in components of the device can thus be better accommodated. Portions brought into the crystalline state may be removed by laser ablation, among other means.

Possible means for heating up to at least a crystallization temperature include a focused electron beam, a needle-shaped heating source, a focused light beam, a laser beam, and laser lithography. The crystallization temperature usually lies between 100 and 400° C., depending on the composition of the material. The heating up to at least the crystallization temperature is preferably carried out in that the layer is locally irradiated with a laser beam. Among the advantages of the use of a laser beam is that details of patterns can be small. A laser beam, moreover, is a known tool. Laser ablation of the material is also possible with a laser beam. The formation of a relief structure in the first layer is advantageous for preventing leakage currents between adjoining conductive portions in the first layer across interposed electrically insulating portions of the first layer.

In an embodiment, a second patterned electrically conducting layer is electrochemically provided on the first layer. The difference in conductivity between the electrically insulating and electrically conducting portions of the first layer causes the second layer to be deposited on and adjacent the electrically conducting portions. Electrochemical enhancement of the electrically conducting portions of the first layer with, for example, copper or gold is favorable for numerous applications in electronic devices. Examples of applications are end contacts, conductor tracks which can be used for strong currents and high frequencies, and thick conductor tracks which can be used as coils.

In a specific embodiment, the electrically insulating portion of the first layer is at least partly removed by etching, for which the second layer serves as an etching mask.

Several etching methods are known to those skilled in the art, such as wet chemical etching and dry etching, anisotropic etching and preferential etching. An etchant which may be used for wet etching of aluminum-germanium is a mixture of iron trichloride hexahydrate and hydrogen chloride. Etching has the result that the electrically insulating portion of the first layer has a lesser surface area. Leakage currents across the electrically insulating portion can be prevented thereby.

These and other aspects of the device according to the invention will be explained in more detail with reference to the drawing, not true to scale, in which.

Figure 7:
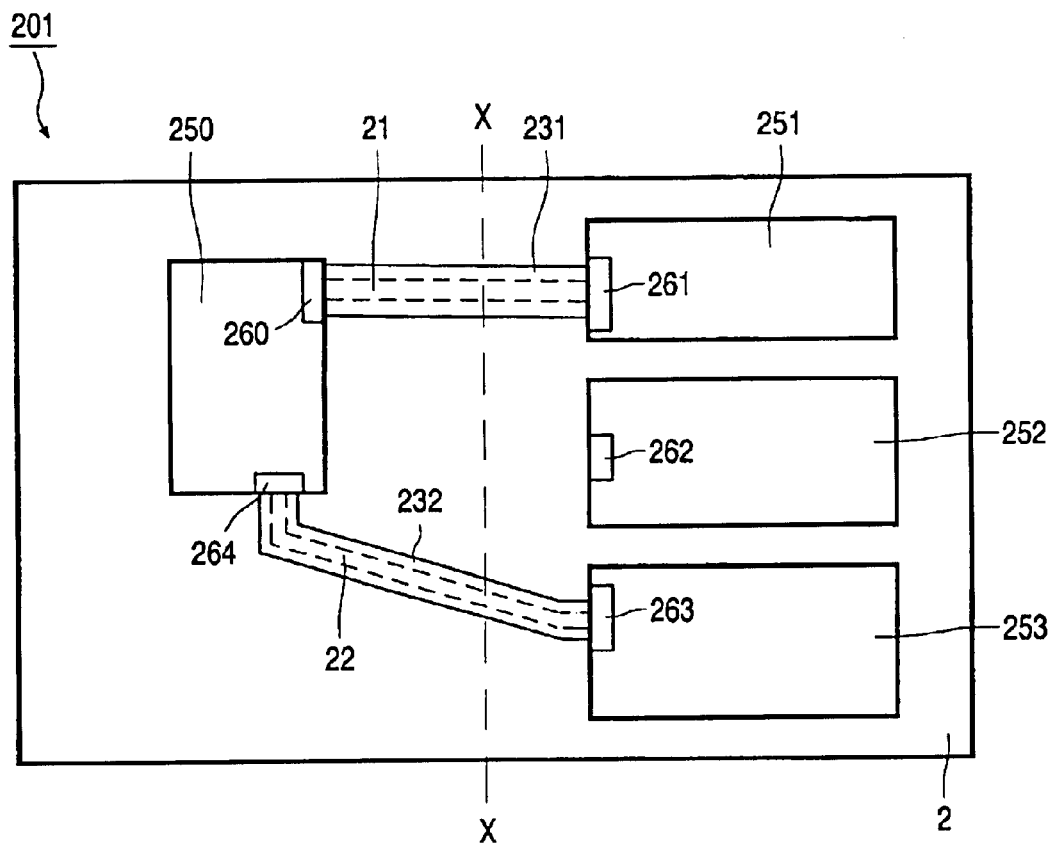
FIG. 7 is a plan view of a fifth embodiment of the electronic device.
Figure 8:
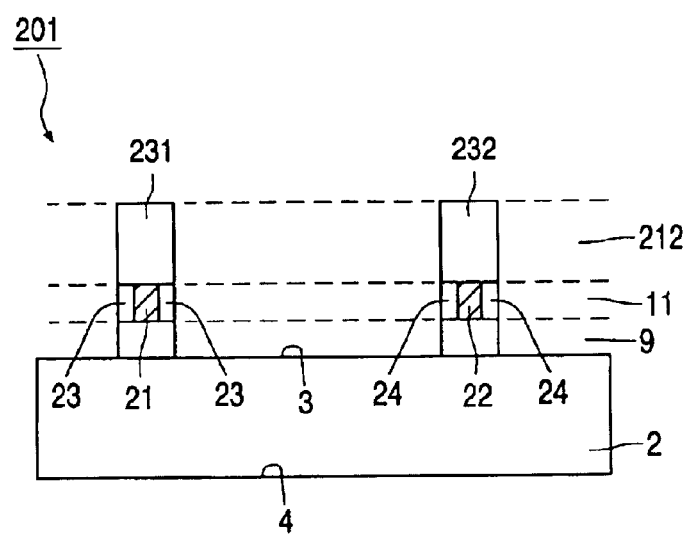
Figure 9:
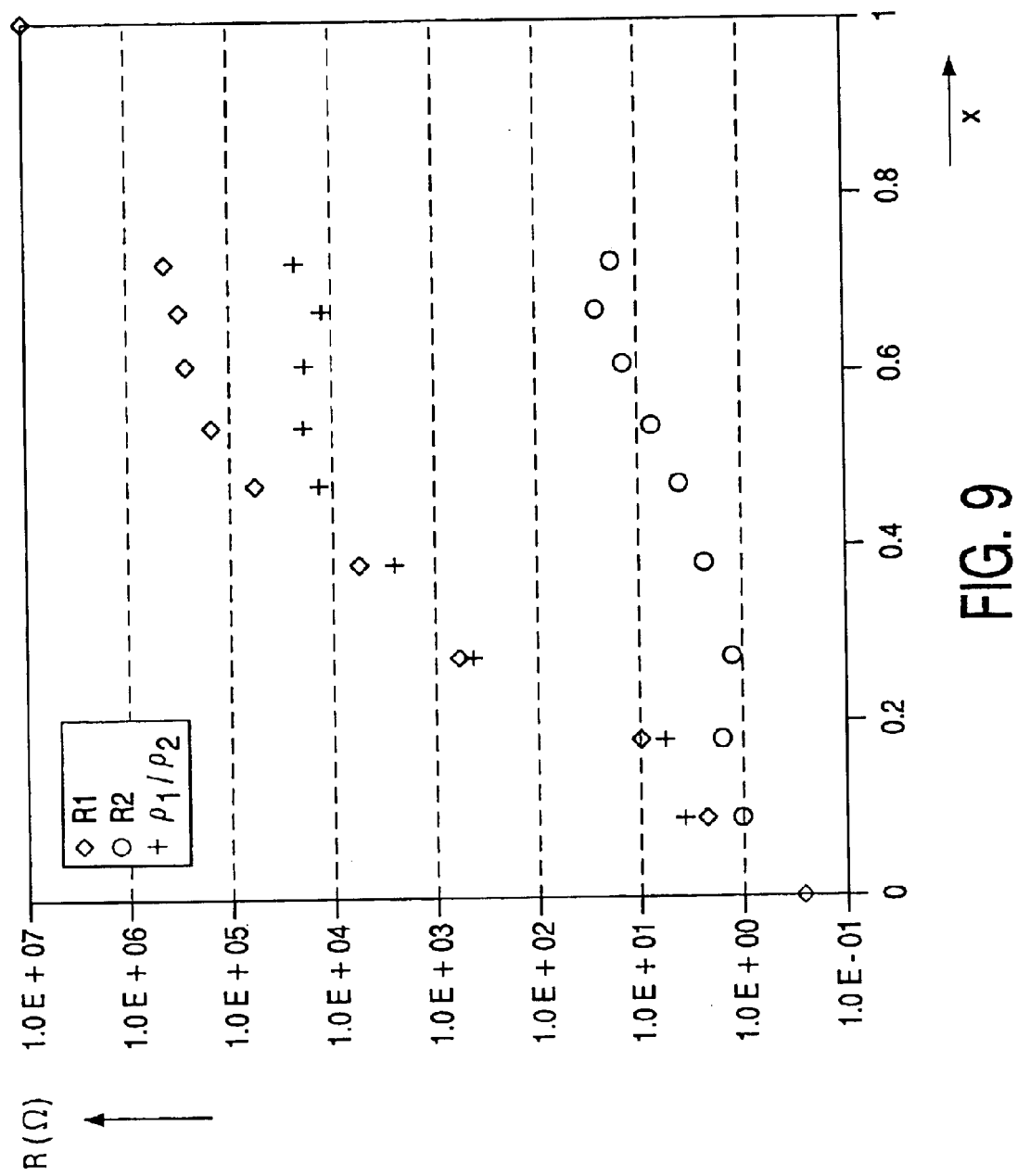

FIG. 8 is a diagrammatic cross-sectional view of the fifth embodiment taken on the line X—X in FIG. 7; and FIG. 9 is a graph in which the square resistance values (in ohms, $\Omega$) in the amorphous state $R_1$ and in the crystalline state $R_2$ (100 nm thick layers, glass substrate) are plotted as a function of the molar fraction of Ge in Al—Ge, as well as the ratio $\rho_1/\rho_2$ between resistivity values $\rho_1$ in the amorphous state and $\rho_2$ in the crystalline state.

TABLE 1

First materials with their molar compositions, square resistance value in the amorphous state, and ratio of resistivity values in the amorphous and crystalline states

| no. | material | mole %1 | mole %2 | $R_{s,1}$ | $\rho_1/\rho_2$ |
|---|---|---|---|---|---|
| 1 | Al—Ge | 91% Al | 9% Ge | 4.7 | 2.2 |
| 2 | Al—Ge | 82% Al | 18% Ge | 19.0 | 6.1 |
| 3 | Al—Ge | 72% Al | 28% Ge | 900 | 161 |
| 4 | Al—Ge | 60% Al | 40% Ge | * | $1.5 \cdot 10^4$ |
| 5 | Al—Ge | 50% Al | 50% Ge | * | $3.4 \cdot 10^4$ |
| 6 | Ge—Sb—Te | 22% Sb | 22% Ge | $9.6 \cdot 10^8$ | $1.2 \cdot 10^6$ |
| 7 | Ge—Sb—Te | 28% Sb | 14% Ge | $3.0 \cdot 10^8$ | $5.0 \cdot 10^5$ |
| 8 | GeTe | 51% Te | 49% Ge | $5.5 \cdot 10^8$ | $6.3 \cdot 10^6$ |
| 9 | GaSb | 50% Sb | 50% Ga | $1.8 \cdot 10^8$ | $9.0 \cdot 10^3$ |
| 10 | AlGe | 23.4% Al | 76.6% Ge | $4.64 \cdot 10^5$ | $1.97 \cdot 10^4$ |
| 11 | AlGe | 20.8% Al | 79.2% Ge | $6.33 \cdot 10^5$ | $2.62 \cdot 10^4$ |
| 12 | AlGe | 17.1% Al | 82.9% Ge | $1.19 \cdot 10^6$ | $3.81 \cdot 10^4$ |
| 13 | AlGe | 13.7% Al | 86.3% Ge | $3.11 \cdot 10^6$ | $8.89 \cdot 10^4$ |

$R_{s,1}$ = square resistance in the amorphous state in ohms ($\Omega$) measured on a glass substrate, the layer being covered by a layer of $(ZnS)_{80}(SiO_2)_{20}$
*= not measured, $Al_2O_3$ substrate

TABLE 2

Transition temperature as a function of composition

| composition (mole %) | substrate | $\rho_1/\rho_2$ | $T_x$ (° C.) |
|---|---|---|---|
| $Al_{50}Ge_{50}$ | $Al_2O_3$ | $3 \cdot 10^4$ | 150 |
| $Al_{55}Ge_{45}$ | $Al_2O_3$ | $>10^4$ | 160 |
| $Al_{59}Ge_{41}$ | glass | $>10^4$ | 210 |

TABLE 2-continued

Transition temperature as a function of composition

| composition (mole %) | substrate | $\rho_1/\rho_2$ | $T_x$ (° C.) |
|---|---|---|---|
| $Al_{60}Ge_{40}$ | $Al_2O_3$ | $2 \cdot 10^4$ | 220 |
| $Al_{70}Ge_{30}$ | $Al_2O_3$ | $\sim 10^3$ | 120 |
| $Al_{70}Ge_{30}$ | glass | $5 \cdot 10^3$ | 150 |
| $Ge_2Sb_2Te_5$ | $Al_2O_3$ | $5 \times 10^4$ | 180 |
| $Al_{91}Ge_9$ | glass | 2.2 | 80 |
| $Al_{34}Ge_{66}$ | glass | $2.1 \cdot 10^4$ | 225 |
| $Al_{17}Ge_{83}$ | glass | $3.8 \cdot 10^4$ | 250 |
| $Al_8Ge_{92}$ | glass | $2.6 \cdot 10^4$ | 320 |

Figure 1:
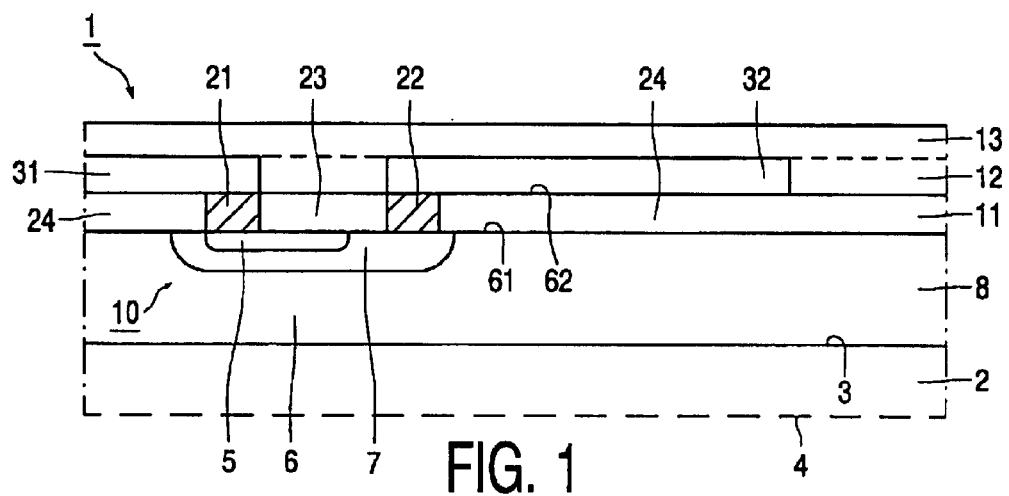
FIG. 1 is a diagrammatic cross-sectional view of a first embodiment of the electronic device.

In FIG. 1, the electronic device 1 is a semiconductor device. The device 1 comprises a substrate 2 of $Al_2O_3$ with a first side 3 and a second side 4. The device 1 is provided with a first semiconductor element 10 at the first side 3. In this embodiment this is a bipolar transistor with an emitter region 5, a base region 6, and a collector region 7. Said regions 5, 6, and 7 are present in a layer 8 of silicon, which layer 8 is covered with a first layer 11 of a material which is aluminum-germanium $Al_{60}Ge_{40}$ in this case. The first layer 11 has a thickness of approximately 50 nm. The first layer 11 comprises electrically insulating portions 23, 24 in the amorphous state and electrically conducting portions 21, 22 in the crystalline state. The electrically conducting portions 21, 22 have a surface area of 100 $\mu m^2$, i.e. 10 by 10 $\mu m$. The distance between a first portion 21 and a second portion 22 is approximately 20 $\mu m$. The resistivity of the material is 2500 $\mu\Omega$ cm in the electrically conducting portions 21, 22, whereas the resistivity is $1 \times 10^7$ $\mu\Omega$ cm in the electrically insulating portions. The resistance of the via is approximately $1.3 \times 10^4$ $\mu\Omega$, and the resistance of the first electrically insulating portion 23 interposed between the electrically conducting portions 21 and 22 is approximately $4 \times 10^{12}$ $\mu\Omega$. The ratio of these resistances is more than $10^8$. The first layer has a first side 61 and a second side 62, which sides 61, 62 are parallel to the first side 4 of the substrate. A second layer 12 of Al, in which second conductor tracks 31 and 32 are defined, is present at the second side 62 of the first layer 11. A passivating layer 13 of silicon oxide is present on the second layer 12. The electrically conducting portion 21 provides an electrical contact between the first conductor track, the electrode 5 in this case, and the second conductor track 31. The first conductor track 5 in this case lies at the first side 61 of the first layer 11, the second conductor track 31 at the second side 62.

FIG. 1 only shows the first semiconductor element 10 for the sake of clarity, but usually the layer 8 will comprise a plurality of such elements. The entire assembly forms the semiconductor device 1. As is known to those skilled in the art, field effect transistors may be present instead of or next to bipolar transistors. As is further known to those skilled in the art, alternative elements such as capacitors, resistors, and diodes may be present in the semiconductor device 1.

Figure 2:
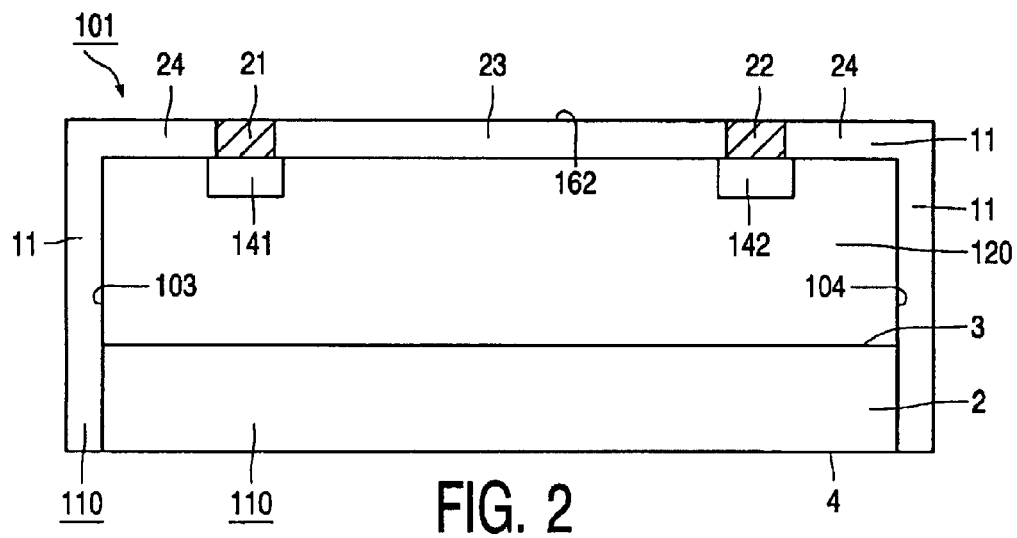
FIG. 2 is a diagrammatic cross-sectional view of a second embodiment of the electronic device.

The electronic device 101 shown not true to scale in FIG. 2 comprises a substrate 2 with a first side 3 and a second side 4. A first component 120 is present at the first side 3 of the substrate 2. The first component 120 is an integrated circuit comprising the conductor tracks 141, 142 on which the external contacts can be connected. A first layer 11 of aluminum-germanium with the composition $Al_{70}Ge_{30}$ is present on the first component 120. This first layer 11 comprises electrically conducting portions 21, 22 in which the aluminum-germanium is in the crystalline state and electrically insulating portions 23, 24 in which the aluminum-germanium is in the amorphous state. The first component 120 is hermetically surrounded by an envelope 110 comprising the first layer 11 and the substrate 2. The envelope 110, which has an outer side 162, seals off the elements defined in the first component 120 against corrosion, gas, and moisture. The conductor tracks 141, 142 can be contacted from the outer side 162 by means of the electrically conducting portions 21, 22.

Figure 3:
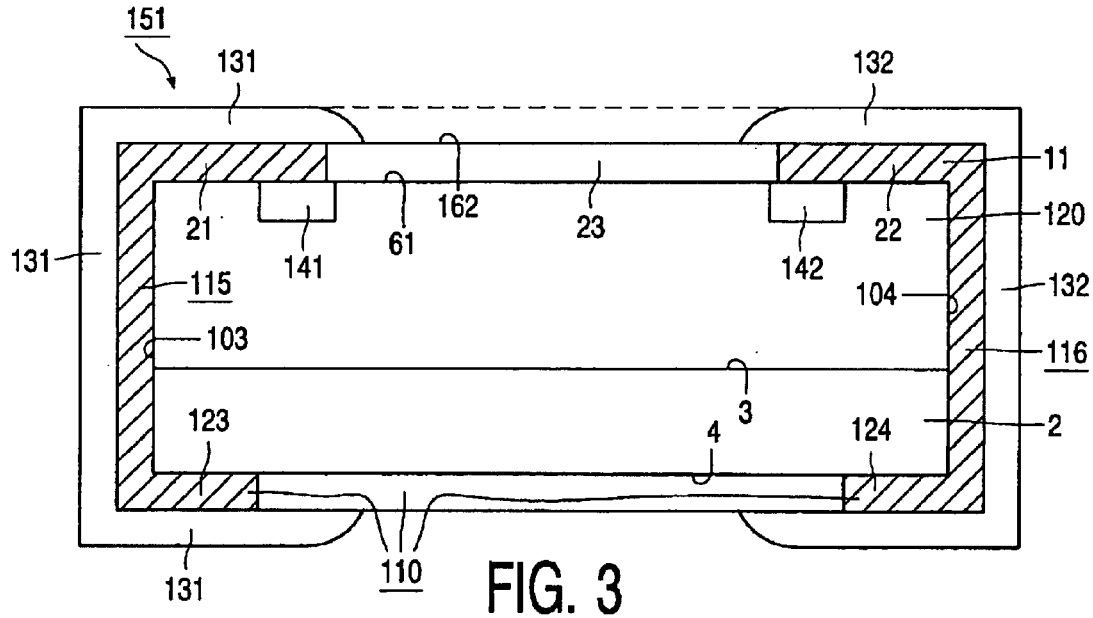
FIG. 3 is a diagrammatic cross-sectional view of a third embodiment of the electronic device.

The device 151 shown in FIG. 3 comprises a first component 120, as did the device 101. The device 151 comprises the first layer 11 and the substrate 2 as the envelope 110 of the first component 120. The first layer 11 extends further at the second side 4 of the substrate 2. The first layer 11 comprises electrically conducting portions 21, 22, 115, 123 and electrically insulating portions 23. The first layer has a first side 61 and a second side 162, which sides 61, 162 are partly parallel to the first side 3 of the substrate 2. The second side 162 is at the same time the outer side 162 of the envelope 110. Cu was selectively deposited through electrochemical deposition at the areas of the electrically conducting portions 21, 22, 115, 116, 123, and 124 at the second side 162 of the first layer 11. This deposition results in the second conductor tracks 131, 132. The electrically conducting portion 21 thus forms an electrically conducting connection between the first conductor track 141 and the second conductor track 131. The conducting portion 22 present between 142 and 132 has a similar function. The second conductor tracks 131, 132 are U-shaped and are present both at the first side 3 and at the second side 4 of the substrate 2. Thus the device 101 is an SMD—Surface Mountable Device.

Figure 4:
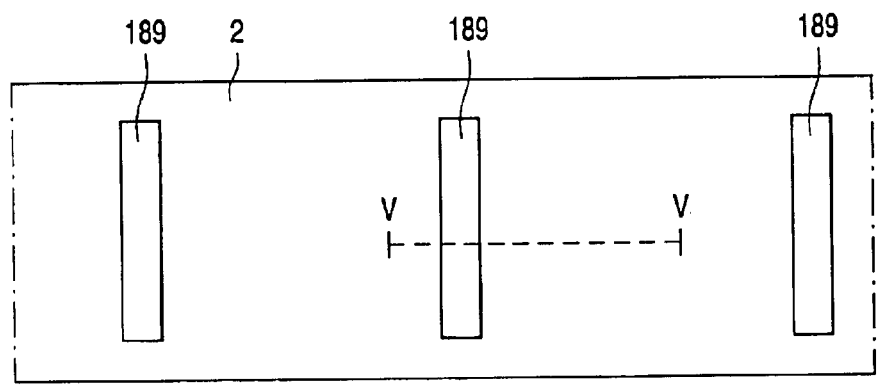
FIG. 4 is a plan view of the substrate of a fourth embodiment of the electronic device.
Figure 5:
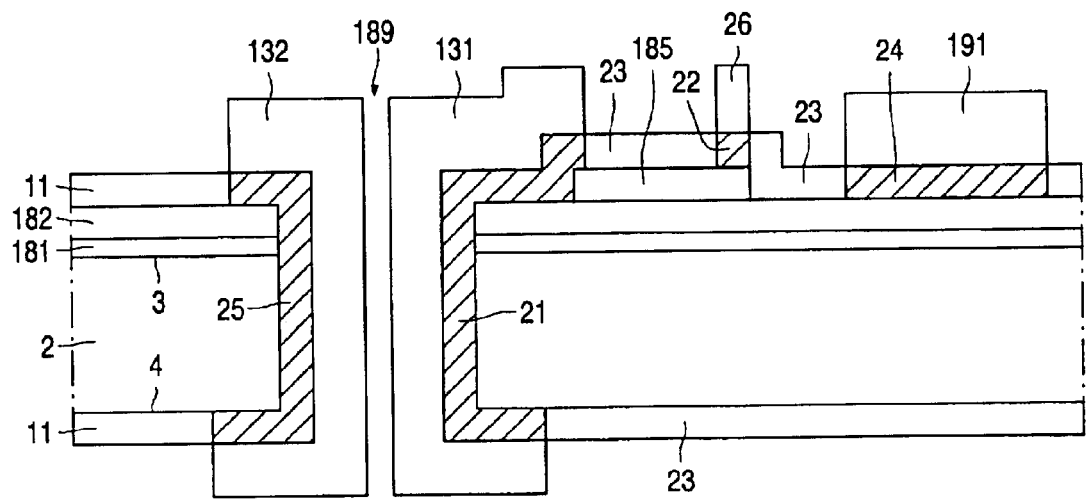
FIG. 5 is a diagrammatic cross-sectional view of an intermediate step in the manufacture of the fourth embodiment of the electronic device.
Figure 6:
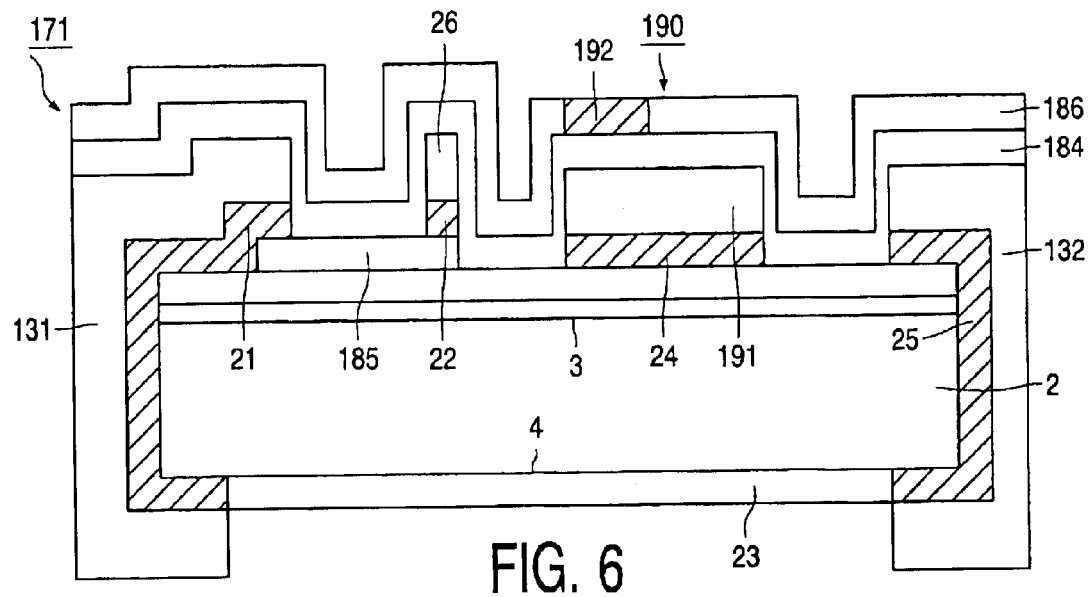
FIG. 6 is a diagrammatic cross-sectional view of the finished fourth embodiment of the electronic device.

A fourth embodiment of the electronic device 171 is shown in FIG. 6, the FIGS. 4 and 5 showing intermediate steps in the manufacture of this embodiment. The manufacture starts with the provision of holes 189 in the substrate 2. A plan view of the resulting substrate 2 is shown in FIG. 4.

FIG. 5 is a diagrammatic cross-section showing a further intermediate step in the manufacture of a number of individual devices. Compared with FIG. 4, a number of layers is now provided at the first side 3 and at the second side 4 of the substrate 2. The cross-section is taken on the line V—V in FIG. 4, but is shown on an enlarged scale as compared with FIG. 4. The substrate 2 is planarized at the first side 3 with a glass layer 181 and subsequently passivated with a passivating layer 182 of $SiN_x$, 1<x<2. A structured resistance layer 185 of W—Ti—N is present thereon. After the resistance layer 185 has been deposited, a layer 11 of AlGe is provided on both sides of the substrate 2 and in the first hole 189. The layer 11 of AlGe is heated with a laser in accordance with a desired pattern, whereby the portions 21, 22, 24, and 25 are converted from the amorphous to the crystalline state. The portions 23 remain in the amorphous state. The pattern in this layer 11 is subsequently electrochemically enhanced with a layer of Cu with the portions 131, 32, 26, and 191.

FIG. 6 is a diagrammatic cross-sectional view of the finished electronic device 171. A plurality of devices 171 are manufactured from the substrate 2, which devices 171 are not separated from one another until after the final deposition step. Starting from the intermediate step shown in FIG. 5, the first side 3 of the substrate 2 is etched. A layer 184 of $SiN_x$, 1<x<2, is provided on the first side 3. A layer 186 of $Al_{50}Ge_{50}$ is provided thereon and is locally converted from the amorphous to the crystalline state by means of a laser. The portion of the layer 186 which is in the crystalline state forms the second electrode 192 of the capacitor 190. The capacitor 190 further comprises as a first electrode the layer 191 and as a dielectric the layer 184. The capacitance of this capacitor 190 depends on the dimension of the portion 192 in which the Al—Ge layer 186 has been converted from the amorphous to the crystalline state. If no trimmable capacitor 190 is desired, the layer 186 may be manufactured from a conductive material such as Al.

The electronic device 171 is now ready in principle. The portion 26 is a conductor track which connects the resistance layer 185 through the via 22 electrically to other components of the device 171, such as an integrated circuit to be provided in an assembling step. The portions 131, 132 are three-dimensional interconnects by means of which the device 171 can be electrically connected to a printed circuit board.

FIG. 7 is a plan view of the electronic device 201. FIG. 8 is a diagrammatic cross-sectional view of this device 201 taken on the line X—X in FIG. 7. The electronic device 201 comprises a substrate 2 made of synthetic resin with an integrated circuit 250 thereon and a first 251, a second 252, and a third memory element 253 which are provided with respective conductor tracks 260, 264; 261; 262; 263. A first layer 11 (not shown in FIG. 7) of the material aluminum-germanium is further present on the substrate. After the manufacture of the device 201, when it has become apparent that the integrated circuit 250 must be in electrical contact with the first 251 and the third memory element 253, the material is brought into the crystalline state through local heating in a first portion 21 and in a second portion 22 of the first layer 11. This is done with an NdYAg laser with a maximum power of 4 W and a power density of $3.2 \times 10^4$ W/cm$^2$. The laser has a wavelength of 532 nm and a pulse frequency of 2 to 6 Hz, so that the pulse energy is 1.5 mJ. The beam diameter of the laser is adjustable between 10 μm and 9 mm. Crystallization of the material takes place in the first 21 and the second portion 22, which involves a separation of the aluminum and the germanium. The result of the transition to the crystalline state is a reduction in the square resistance from $10^7$ to approximately $5 \times 10^3$ Ω.

FIG. 8 is a diagrammatic cross-sectional view taken on the line X—X showing the situation after the crystallization in the first layer 11 as indicated above and a subsequent electrochemical enhancement. The substrate 2 has a first side 3 and a second side 4. At the first side 3 of the substrate 1, there is a 100 nm thick layer 9 of Al and a 100 nm thick first layer 11 of the material $Al_{55}Ge_{45}$ which is deposited by sputtering. The first layer 11 is in the amorphous state prior to patterning. After the first layer 11 has been patterned, a second layer 212 of Cu is electrochemically deposited on the first layer by means of electroplating. The Cu is deposited mainly on the first 21 and the second portion 22, thus forming the conductor tracks 231, 232. Then the Al layer 9 and the first layer 11 are etched, the second layer 212 serving as an etching mask for this. The result of this is that the substrate 1 is free from the covering of the Al layer 9 and the first layer 11 at the first side 9 between the first 21 and the second portion 22, except in the vicinity of the first 21 and the second portion 22.

FIG. 9 shows a graph in which a few relevant values of the Al—Ge are plotted as a function of the molar fraction x of Ge in the Al—Ge: the square resistance (in ohms Ω) in the amorphous state $R_1$ and in the crystalline state $R_2$, and the ratio $\rho_1/\rho_2$ of the resistivity values $\rho_1$ in the amorphous state and $\rho_2$ in the crystalline state. The square resistance values were measured with 100 nm thick layers of $Al_{1-x}Ge_x$ on a glass substrate. It is apparent that the square resistance in the amorphous state rises strongly with the molar fraction x. For x=0.6 the square resistance is approximately five decades greater than for x=0.1. The square resistance in the crystalline state rises to a limited degree only with the molar fraction x, at least over the range of 0.1<x<0.6. The square resistance in the crystalline state is approximately one decade greater for x=0.6 than for x=0.1. The ratio of these square resistance values $R_1/R_2$ is equal to the ratio $\rho_1/\rho_2$ of the resistivity $\rho_1$ in the amorphous state and $\rho_2$ in the crystalline state. It is apparent from the graph that the material Al—Ge is highly suitable for use in a first layer of a semiconductor device when x is greater than 0.2.

What is claimed is:

1. A method of manufacturing an electronic device comprising the step of patterning a first layer (11) in accordance with a chosen pattern, which first layer (11) lies on a substrate and comprises an electrically conducting portion (21) and an electrically insulating portion (23) after patterning, characterized in that the first layer (11) comprises a material which is built up from at least a first and a second element, and which has an amorphous state and a crystalline state, wherein the first element is aluminum and the second element is germanium, the first layer having a germanium content being at least 20%, the first layer (11) is heated in accordance with the chosen pattern up to at least a crystallization temperature of the material, whereupon the material is present in its crystalline state in the conducting portion (21) and in the amorphous state in the electrically insulating portion (23), wherein a second patterned electrically conducting layer (112) is electrochemically provided on the first layer (11).

2. A method as claimed in claim 1, characterized in that the electrically insulating portion (23) of the first layer (11) is at least partly removed by etching, for which the second layer (112) serves as an etching mask.

3. A method as claimed in claim 1, wherein the first layer (11) further comprises at least one of the following: gallium and indium.

4. A method as claimed in claim 1, characterized in that the material is heated through local irradiation of the first layer (11) with a laser beam.

* * * * *